(12) United States Patent
Silver et al.

(10) Patent No.: US 8,116,704 B2
(45) Date of Patent: Feb. 14, 2012

(54) SWITCHING POWER SUPPLY

(75) Inventors: Gregory S. Silver, St. Augustine, FL (US); David F. Sorrells, Middleburg, FL (US); Gregory S. Rawlins, Heathrow, FL (US)

(73) Assignee: ParkerVision, Inc., Jacksonville, FL (US)

( * ) Notice: Subject to any disclaimer, the term of this patent is extended or adjusted under 35 U.S.C. 154(b) by 986 days.

(21) Appl. No.: 11/979,852

(22) Filed: Nov. 8, 2007

(65) Prior Publication Data

US 2008/0122543 A1 May 29, 2008

Related U.S. Application Data

(60) Provisional application No. 60/857,777, filed on Nov. 9, 2006.

(51) Int. Cl.
*H04B 1/04* (2006.01)

(52) U.S. Cl. .................... 455/127.1; 455/127.4

(58) Field of Classification Search .............. 455/91, 455/115.1, 126, 127.1, 127.2, 127.4; 330/129, 330/279, 282; 375/295, 296; 323/282
See application file for complete search history.

(56) References Cited

U.S. PATENT DOCUMENTS

| | | | |
|---|---|---|---|
| 7,184,723 B2 | 2/2007 | Sorrells et al. | |
| 7,245,180 B2 * | 7/2007 | Earl et al. | 455/127.1 |
| 7,355,470 B2 | 4/2008 | Sorrells et al. | |
| 2004/0203992 A1 | 10/2004 | Yun | |
| 2005/0007083 A1 | 1/2005 | Yang et al. | |
| 2005/0141251 A1 | 6/2005 | Allwyn et al. | |
| 2005/0162142 A1 | 7/2005 | Kernahan et al. | |
| 2006/0001410 A1 | 1/2006 | Ishikawa et al. | |
| 2006/0022656 A1 | 2/2006 | Leung et al. | |
| 2006/0104384 A1 | 5/2006 | Sorrells et al. | |

OTHER PUBLICATIONS

International Search Report for PCT/US2007/023461, dated Jun. 18, 2008, 10 pp.

* cited by examiner

*Primary Examiner* — Thanh Le
(74) *Attorney, Agent, or Firm* — Sterne, Kessler, Goldstein & Fox P.L.L.C.

(57) ABSTRACT

Methods and systems for enhancing system efficiency in a power amplification, modulation, and transmission system are provided. Embodiments include determining output power characteristics of a selected modulation scheme to be employed in data transmission, determining a most probable output power point of operation for the selected modulation scheme based on the output power characteristics, and controlling the output stage power supply of the system to operate at substantially optimal efficiency at the most probable output power point of operation.

11 Claims, 19 Drawing Sheets

SWITCHING POWER SUPPLY

CROSS-REFERENCE TO RELATED APPLICATIONS

The present application claims the benefit of U.S. Provisional Patent Application No. 60/857,777, filed Nov. 9, 2006, which is incorporated herein by reference in its entirety.

The present application is related to U.S. patent application Ser. No. 11/256,172, filed Oct. 24, 2005, now U.S. Pat. No. 7,184,723 and U.S. patent application Ser. No. 11/508,989, filed Aug. 24, 2006, both of which are incorporated herein by reference in their entireties.

BACKGROUND OF THE INVENTION

1. Field of the Invention

The present invention relates generally to modulation and power amplification and related network and system control functions. More particularly, the invention relates to methods and systems for enhancing system parameters including efficiency in power amplification systems.

2. Background Art

The efficiency of a power supply directly affects the efficiency of the power amplification system using the power supply. Further, in the case of mobile or portable battery powered wireless devices, the voltage and current requirements of the radio frequency (RF) transmitter used in the devices are largely determined by the power amplifier technology and system requirements.

As such, the power supply efficiency not only affects the efficiency of the power modulation and amplification system but also the efficiency of the mobile device using the power amplification system.

There is a need therefore for power supply architectures, design techniques, and operation modes that affect and/or optimize the overall system efficiency of the modulation and power amplification system.

BRIEF DESCRIPTION OF THE INVENTION

The present invention relates to systems and methods of RF power transmission, modulation, and amplification. Systems and methods of RF power transmission, modulation, and amplification also referred to herein as Vector Power Amplification (VPA) are described in related U.S. patent application Ser. No. 11/256,172, filed Oct. 24, 2005, now U.S. Pat. No. 7,184,723 and U.S. patent application Ser. No. 11/508,989, filed Aug. 24, 2006, both of which are incorporated herein by reference in their entireties. It is noted that the invention is not limited to these VPA examples but can be applied to other transmitter functions and circuitry such as modulators, amplifiers, filters, and control circuitry.

The present invention provides methods and systems for enhancing system efficiency in a power amplification, modulation, and transmission system.

According to embodiments of the present invention, the overall system efficiency can be affected and/or optimized according to, but not limited to, the average or most probable output power levels, maximum power output level, battery voltage and/or changes in battery voltage, amplifier and/or modulator voltage and current requirements, power control requirements, adjacent channel power requirements (ACPR), adjacent channel leakage requirements (ACLR), standing wave ratio (SWR) requirements, in-band noise performance requirements, and out-of-band noise performance requirements such as is required by GSM and other standards based cell phone signals. In mobile or portable battery powered devices, this results in extended battery life, smaller battery size, and increased and/or optimized output power for various power output levels, connectivity range, number of network nodes, and reliability and longevity.

Methods according to embodiments of the present invention include determining output power characteristics of a selected modulation scheme to be employed in data transmission, determining a probable (in certain embodiments, a most probable) output power point of operation for the selected modulation scheme based on the output power characteristics, and controlling the output stage power supply of the system to operate at substantially optimal efficiency at the most probable output power point of operation. In an embodiment, the output power characteristics include the probability distribution function of output power using the selected modulation scheme. In another embodiment, the output power characteristics are determined according to network statistics.

Provided methods for enhancing system efficiency can be used with traditional power amplifiers, vector power amplifiers, and multiple-input-single-output (MISO) power amplifiers (such as, but not limited to, the VPA examples described in the patent and patent application cited above). Further, the methods can be applied with various modulation schemes including, but not limited to, GSM, W-CDMA, CDMA 2000, EvDO, EDGE, HSUPA, and OFDM.

Systems implementing the above described methods include a mechanism to bypass the power supply circuitry at a pre-determined threshold, further increasing the system efficiency. In an implementation, a bypass switch control circuitry is used together with the power supply circuitry, to cause the bypass of the power supply circuitry using a bypass switch when the pre-determined threshold is exceeded. In an embodiment, the threshold is defined in terms of output power, and the bypass switch is engaged or disengaged when the output power exceeds or falls below the threshold. In another embodiment, the power supply is bypassed when the noise power on or near the output frequency (frequency of the output signal) exceeds a threshold.

In an embodiment, the bypass switch threshold can be changed in real time by wirelessly downloading information to the system. This wireless information can be sent from a wireless network or from another device. In an embodiment, the bypass switch threshold is modified based on battery voltage. In another embodiment, the bypass switch threshold is modified based on battery life requirements. In a further embodiment, the bypass switch threshold is modified based on output power requirements and/or on power supply current output requirements.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure and methods particularly pointed out in the written description and claims hereof as well as the appended drawings.

BRIEF DESCRIPTION OF THE DRAWINGS

Embodiments of the present invention will be described with reference to the accompanying drawings, wherein generally like reference numbers indicate identical or functionally similar elements. Also, generally, the leftmost digit(s) of the reference numbers identify the drawings in which the associated elements are first introduced.

DETAILED DESCRIPTION OF THE INVENTION

Overview

Methods and systems for enhancing system efficiency in a power amplification, modulation, and transmission system are provided herein.

According to embodiments of the present invention, the overall system efficiency can be affected and/or optimized according to, but not limited to, the average or most probable output power levels, maximum power output level, battery voltage and/or changes in battery voltage, amplifier and/or modulator voltage and current requirements, power control requirements, adjacent channel power requirements (ACPR), adjacent channel leakage requirements (ACLR), standing wave ratio (SWR) requirements, in-band noise performance requirements, and out-of-band noise performance requirements such as is required by GSM and other standards based cell phone signals. In mobile or portable battery powered devices, this results in extended battery life, smaller battery size, and increased and/or optimized output power for various power output levels, connectivity range, number of network nodes, and reliability and longevity.

According to embodiments of the present invention, the efficiency of all types of amplifiers, including, but not limited to, MISO amplifiers can be improved over various output power levels by designing a variable voltage switching power supply based on system criteria, such as, but not limited to, network statistics and/or typical operating conditions.

According to further embodiments, an optional bypass switch architecture can be used as part of the power supply design to further enhance the system efficiency, reduce the system noise floor, and increase the available output current of the power supply. These advantages reduce the amount of circuitry required to support multiple modulation methods and output powers.

Embodiments for enhancing system efficiency can be used with traditional power amplifiers, vector power amplifiers, and multiple-input-single-output (MISO) power amplifiers. Further, embodiments can be applied with various modulation schemes including, but not limited to, GSM, W-CDMA, CDMA 2000, EvDO, EDGE, HSUPA, and OFDM.

Systems implementing some of the above described embodiments include a mechanism to bypass the power supply circuitry at a pre-determined threshold, further increasing the system efficiency. In an implementation, a bypass switch control circuitry is used together with the power supply circuitry, to cause the bypass of the power supply circuitry when the pre-determined threshold is exceeded. In an embodiment, the threshold is defined in terms of output power, and the bypass switch is engaged or disengaged when the output power exceeds or falls below the threshold. In another embodiment, the power supply is bypassed when the noise power on or near the output frequency (frequency of the output signal) exceeds a threshold.

Effect of Power Supply Efficiency on System Efficiency

Figure 1:
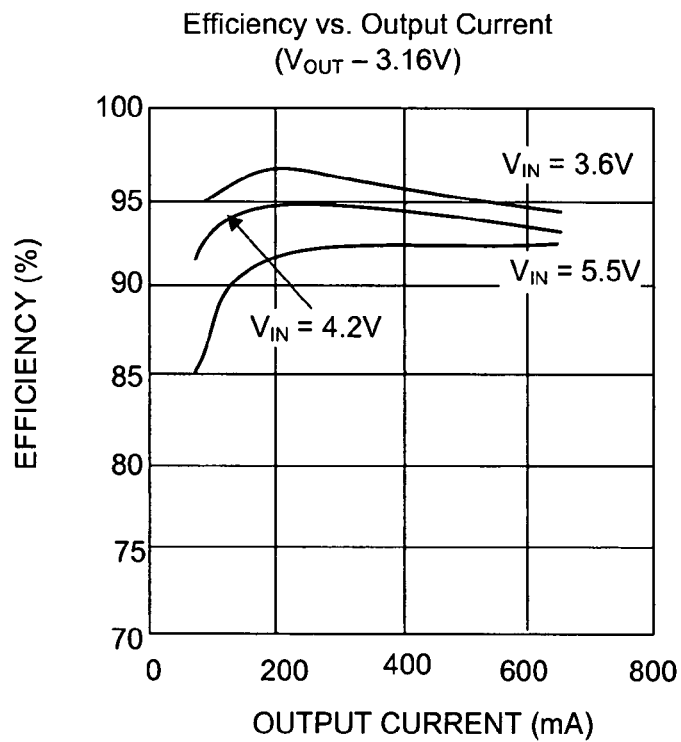
FIG. 1 illustrates exemplary plots of efficiency versus output current of a typical switching power supply for two exemplary values of output power.
Figure 1:
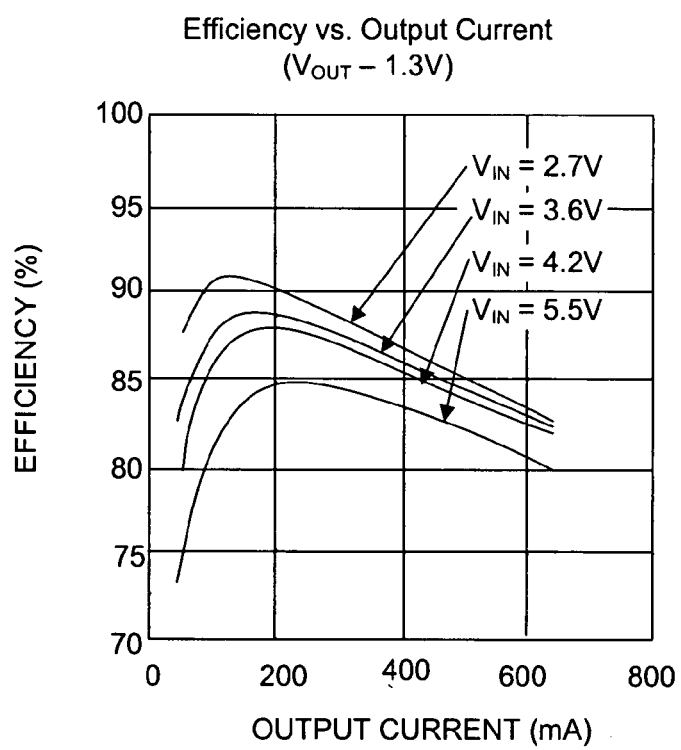

FIG. 1 illustrates exemplary plots 102 and 104 of efficiency versus output current of a typical switching power supply for two exemplary values of output power.

As illustrated in plots 102 and 104, the power supply is most efficient when the output current is between 100 and 200 milliamps (ma) depending on the input and output voltages. Also, when plots 102 and 104 are extended beyond 650 mA for the output current, the power supply efficiency would continue to decrease as the output current increases.

The power supply efficiency directly affects the efficiency of the entire power amplification system using the power supply. Further, in the case of mobile or portable battery powered wireless devices including, but not limited to, cellular phones, wireless LAN devices, and WiMax devices and systems, voltage and current requirements of the radio frequency (RF) transmitter are largely determined by the power amplifier technology and system requirements. As such, the efficiency of the power supply of a power amplification system significantly affects the efficiency of the mobile device using said power amplification system.

To highlight this problem, consider, for example, a scenario where the battery voltage (power supply input voltage, $V_{IN}$) is 3.6 V and the output voltage (power supply output voltage, $V_{OUT}$) is 3.16 V, and where the power supply drives a power amplifier that is 50% efficient generating a +30 dBm output power. Accordingly, the power supply current will be approximately 633 mA. From plot 102 of FIG. 1, this results in a power supply efficiency of approximately 94%, which is 4% less than the optimum 98% achievable with a power supply current of approximately 190 mA.

At lower output voltages ($V_{OUT}$), as illustrated in plot 104 for example, the problem becomes more pronounced, and the power supply efficiency approaches approximately 80% at 633 mA, which is 18% less efficient than when the power supply is operating in its optimum voltage and current range.

The effect on system efficiency is significant. For example, when the power amplifier is operating at 50% efficiency and the power supply is operating at 94% efficiency, the system efficiency is 0.5×0.94=0.47 or 47%. Similarly, when the power amplifier is operating at 50% efficiency and the power supply is operating at 80% efficiency, the system efficiency is 0.5×0.8=0.4 or 40%.

Power Supply Design Optimization for Enhanced System Efficiency

In this section, power supply design embodiments to enhance system efficiency are provided. For example, switching power supplies can be designed to operate in pre-determined output voltage and current ranges that result in increased efficiency of the power supply and consequently in increased system efficiency. These embodiments can be used to control both the efficiency and the output power level of traditional power amplifiers (PAs) and/or multiple-input-single-output (MISO) amplifiers.

One set of criteria that can be used to design both the power supply and the power amplifier for maximized system efficiency include the network characteristics and/or statistics. An exemplary network characteristic of a code division multiple access (CDMA) network is shown in FIG. 2, which illustrates a probability density function (PDF) 200 of a handset output power used on a reverse link (handset to base station) and measured at the power amplifier output of the handset.

Figure 2:
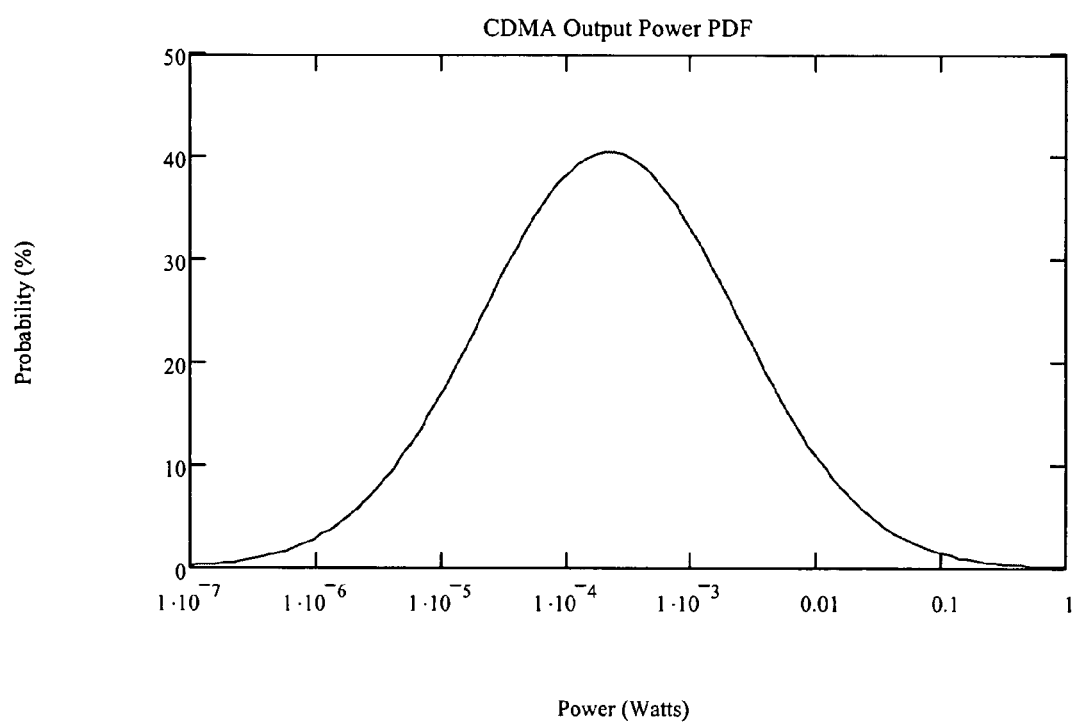
FIG. 2 illustrates an example probability density function (PDF) of a handset output power.

PDF 200 is shown according to a log normal scale in FIG. 2 and provides the time probability that the handset spends transmitting using a given output power level, according to the transmitted CDMA waveform.

Based on PDF 200, it would be sufficient to increase system efficiency to design a power supply and/or amplifier system that maintains or increases the system efficiency at power levels below +30 dBm. Indeed, mathematical analysis shows that the mean or expected value of PDF 200 is approximately +17 dBm or 50 milliwatts (mW). Further, since the probability of transmission at +17 dBm is higher than the probability of transmission at +30 dBm, system efficiency increases at +17 dBm will have a greater overall effect on extended battery life and/or battery size than system efficiency increases at +30 dBm.

Figure 3:
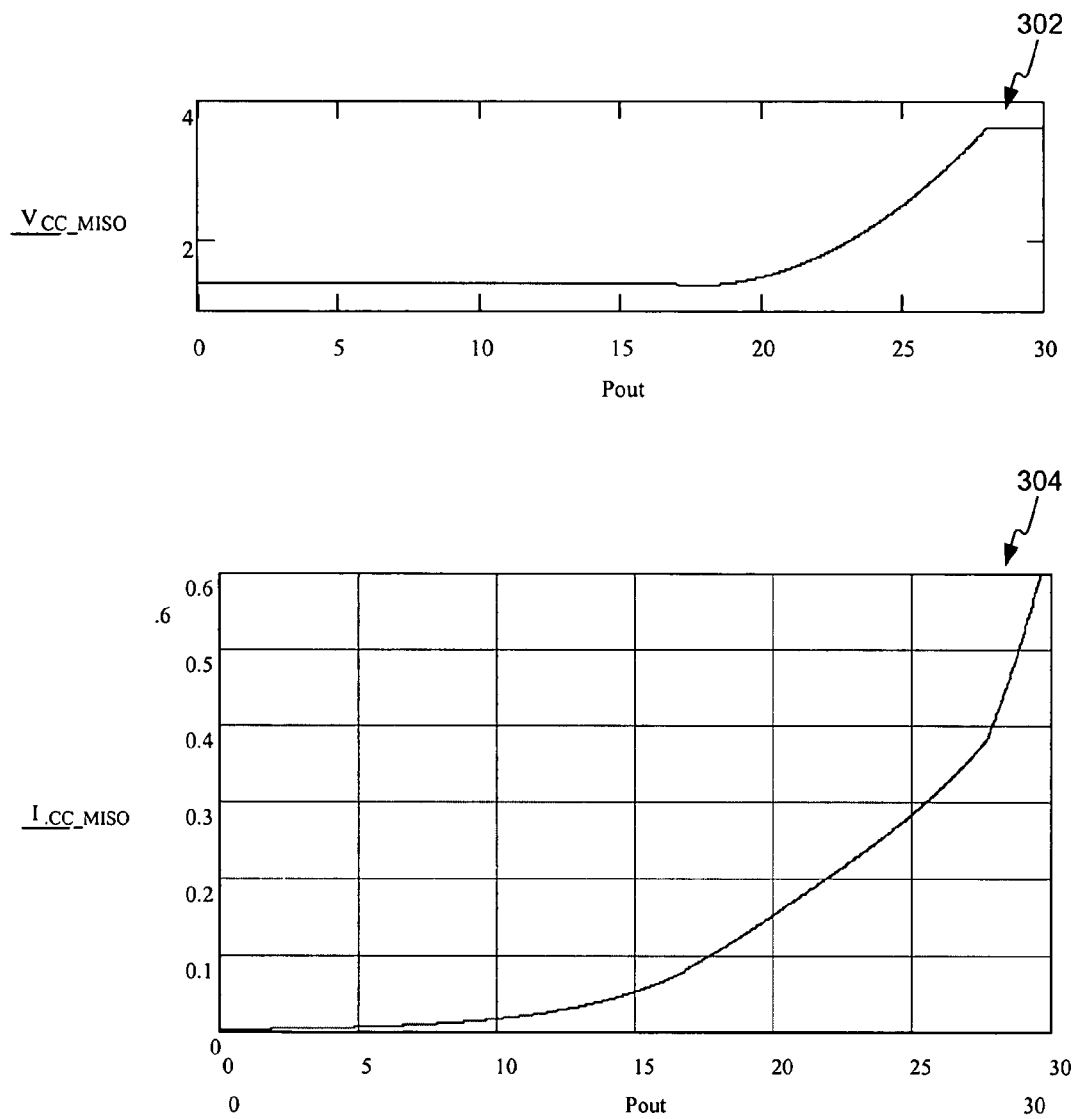
FIG. 3 illustrates exemplary plots of power supply output voltage and power supply output current versus output power of an example multiple-input-single-output (MISO) amplifier.

The above described CDMA design criteria can be applied in the case of a multiple-input-single-output (MISO) amplifier, examples of which are described in the patent and patent application cited above. FIG. 3 illustrates exemplary plots 302 and 304 of power supply output voltage and power supply output current, respectively, versus output power of an example MISO amplifier.

Plots 302 and 304 illustrate the power supply output voltage and output current that are required by an example MISO amplifier to achieve a CDMA power control range. For ease of illustration, the output power range in plots 302 and 304 is limited to 0 dBm to +30 dBm instead of −40 dBm to +30 dBm, since the most probable output power occurs at +17 dBm.

In an example MISO amplifier, the power supply output voltage is applied at the collector/drain of the MISO amplifier depending on the MISO amplifier configuration used. As illustrated in exemplary plot 302, the collector/drain voltage range of the MISO amplifier is +1.39V to +3.6V. Also, for an output power of +17 dBm, the collector/drain voltage of the MISO amplifier is approximately +1.39V.

Accordingly, to achieve the highest system efficiency possible using example CDMA PDF 200, the switching power supply should be designed to operate at its highest efficiency when its output voltage is approximately +1.39V and, correspondingly from exemplary plot 304, when its output current is approximately 100 mA.

Note that the switching power supply may be designed to vary its highest efficiency point of operation according to the selected data modulation and transmission scheme. As would be understood by a person skilled in the art, the output power characteristics of transmission schemes (e.g., CDMA, CDMA2000, GSM, etc.) differ from one scheme to another. Accordingly, the most probable output power point of operation also varies from one transmission scheme to another, and, consequently, so does the highest efficiency point of operation of the power supply.

Figure 11:
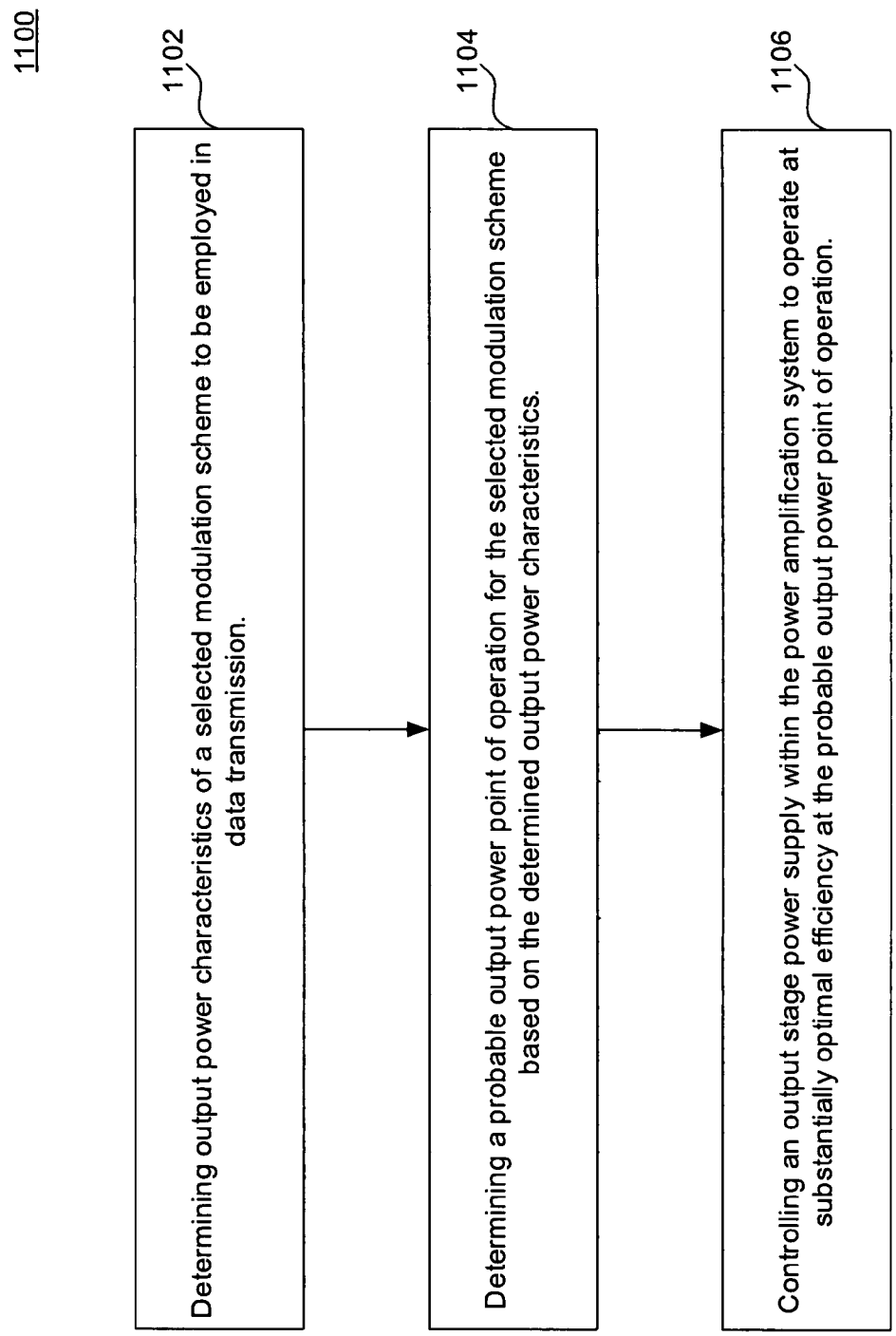
FIG. 11 is a process flowchart of a method for enhancing system efficiency in a power amplification system according to an embodiment of the present invention.

Based on the above, a method for enhancing system efficiency in a power amplification system is provided and is illustrated in process flowchart 1100 of FIG. 11. The power amplification system can be a traditional power amplifier, a vector power amplifier, or a multiple-input-single-output (MISO) amplifier. Process 1100 includes steps 1102, 1104, and 1106.

Process 1100 begins in step 1102, which includes determining output power characteristics of a selected modulation scheme to be employed in data transmission. In an embodiment, the output power characteristics include a probability distribution function of output power using the selected modulation scheme. In another embodiment, the output power characteristics are determined according to network statistics. The selected modulation scheme can be any one of GSM, W-CDMA, CDMA 2000, EvDO, EDGE, HSUPA, and OFDM.

Step 1104 includes determining a probable (in certain embodiments, a most probable) output power point of operation for the selected modulation scheme based on the determined output power characteristics.

Step 1106 includes controlling an output stage power supply within the power amplification system to operate at substantially optimal efficiency at the probable output power point of operation.

Power Supply Efficiency Optimization

In addition to designing/controlling the power supply to operate optimally in terms of efficiency at the most probable output power, the overall power supply efficiency can be improved to increase system efficiency. As will be described in the exemplary embodiments below, the system efficiency can be further increased by bypassing the power supply when the required output voltage (or the output power) exceeds a pre-determined threshold. For example, referring to exemplary plot 302, an optional power supply bypass switch can be used to bypass the power supply when the power supply output voltage required by the MISO amplifier reaches 3.6V, which corresponds to an output power of +26 dBm or 400 mW. By bypassing the power supply, any loss in system efficiency due to the power supply efficiency can be eliminated.

Figure 4:
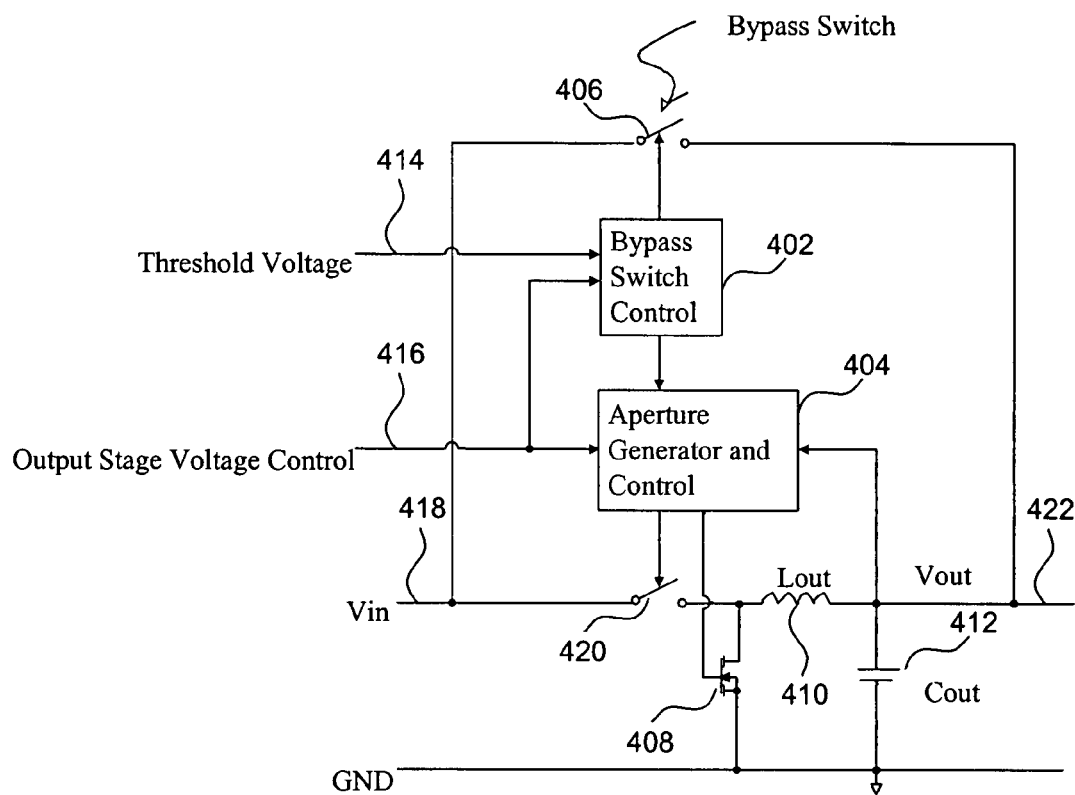
FIG. 4 illustrates an example step down switching power supply having a bypass switch architecture.

FIG. 4 illustrates an example step down (buck) switching power supply 400 having a bypass switch architecture.

Power supply 400 receives an input voltage signal $V_{IN}$ 418, an Output Stage Voltage Control signal 416, and a Threshold Voltage signal 414.

Input voltage signal $V_{IN}$ 418 is typically received from a battery and is set according to, among other requirements, the device using the power amplifier. In exemplary plots 102 and 104, for example, $V_{IN}$ 418 takes values of 2.7V, 3.6V, 4.2V, and 5.5V.

Output Stage Voltage Control signal 416 is received from a control module configured to control the power supply voltage provided to the output stage of the power amplifier. In example 400, Output Stage Voltage Control signal 416 controls an Aperture Generator and Control module 404 of power supply 400.

Threshold Voltage 414 may also be received from the same control module as Output Stage Voltage Control signal 416. The function of Threshold Voltage 414 is to control a Bypass Switch Control module 402 of power supply 400.

Threshold Voltage 414 may be fixed or programmable. Threshold Voltage 414 may vary depending on network statistics and/or network waveforms including, but not limited to, GSM, W-CDMA, CDMA2000, EvDO, EDGE, HSUPA, OFDM, or others. In an embodiment, Threshold Voltage 414 can be changed in real time by wirelessly downloading information to the system. For example, Threshold Voltage 414 can be downloaded to the mobile device or portable unit using power supply 400 from a network provider. In another embodiment, Threshold Voltage 414 can be pre-programmed based on waveform efficiency requirements and/or modified or adjusted based on battery life requirements. In a further embodiment, Threshold Voltage 414 is modified based on output power requirements and/or on power supply current output requirements.

Referring back to FIG. 4, in addition to modules 402 and 404, power supply 400 includes a Bypass Switch 406, an input switch 420, a switching transistor 408, and an output LC circuit comprised of an inductor $L_{OUT}$ 410 and a capacitor $C_{OUT}$ 412.

Power supply 400 operates in two modes: normal mode and bypass mode.

In normal mode, input voltage signal $V_{IN}$ 418 is received at input switch 420, which is controlled by Aperture Generator and Control module 404.

Aperture Generator and Control module 404 is configured to control input switch 420 to couple input voltage signal $V_{IN}$ 418 to the collector/drain of switching transistor 408. As such, $V_{IN}$ 418 provides a bias voltage for the collector/drain of switching transistor 408.

Aperture Generator and Control module 404 is also configured to control the base/gate voltage of switching transistor 408, effectively controlling the point of operation and subsequently the gain of switching transistor 408. In an embodiment, Aperture Generator and Control module 404 uses Output Stage Voltage Control signal 416 to determine the required power supply output voltage and, accordingly, controls the base/gate voltage of switching transistor 408. In another embodiment, Aperture Generator and Control module 404 receives a feedback signal of the power supply output voltage $V_{OUT}$ 422. Aperture Generator and Control module 404 may then adjust its control of switching transistor 408, if necessary.

In example power supply 400, switching transistor 408 is illustrated as a single NMOS transistor. As would be understood by a person skilled in the art, embodiments according to the present invention are not limited by this configuration and may include, among other configurations, one or more NMOS, PMOS, NPN, and PNP transistors.

At the output (collector/drain node) of switching transistor 408, inductor $L_{OUT}$ 410 is an exemplary output reactance that meets the voltage and current output requirements of the supply. The reactance can be inductive or capacitive. $C_{OUT}$ 412 acts to filter the AC components of the output of switching transistor 408. As such power supply output voltage $V_{OUT}$ 422 is substantially a DC voltage.

In Bypass mode, $V_{IN}$ 418 is directly coupled to the power supply output node, which provides power supply output voltage $V_{OUT}$ 422. Bypass mode operation is described below.

Bypass Switch Control module 402 receives Threshold Voltage signal 414 and Output Stage Voltage Control signal 416. Threshold Voltage signal 414 determines at which value of the power supply output voltage power supply 400 switches to bypass mode. Output Stage Voltage Control signal 416 includes information about the target power supply output voltage and thus allows Bypass Switch Control module 402 to determine the value of the power supply output voltage.

Bypass Switch Control module 402 compares Threshold Voltage 414 and the value of the power supply output voltage to determine whether power supply 400 should switch to bypass mode. When the power supply output voltage exceeds Threshold Voltage 414, Bypass Switch Control module 402 controls Bypass Switch 406 to couple input voltage signal $V_{IN}$ 418 to the power supply output node. At the same time, Bypass Switch Control module 402 controls Aperture Generator and Control module 404 to cause it to de-couple input voltage signal $V_{IN}$ 418 from the collector/drain node of switching transistor 408 and to shut off switching transistor 408.

Accordingly, Bypass Switch Control module 402 bypasses the power supply when the output power exceeds a determined threshold, thereby increasing the efficiency of the power supply for output powers exceeding the determined threshold. In another embodiment, Bypass Switch Control module 402 bypasses the power supply when the noise power on or near the output frequency exceeds a threshold.

As would be understood by a person skilled in the art based on the teachings herein, several parameters can be affected and/or optimized using the power supply design of FIG. 4. For example, the operation dynamic range of the power supply is reduced through the bypass option, which increases the efficiency over the smaller power supply control range. Also, since the switching portion of the supply does not have to carry the maximum voltage and current required, the size and value of the switch (including the switching inductor or capacitor) can be reduced. Additionally, in-band and out-of-band noise can be reduced as switching components typically cause noise. This is especially important at higher power output levels because all cellular phone standards have a maximum "close in" (20 MHz offset) receive band noise floor requirement. Further, as the battery voltage changes during operation, the higher output power levels can be maintained and controlled over a wider battery voltage range.

Figure 5:
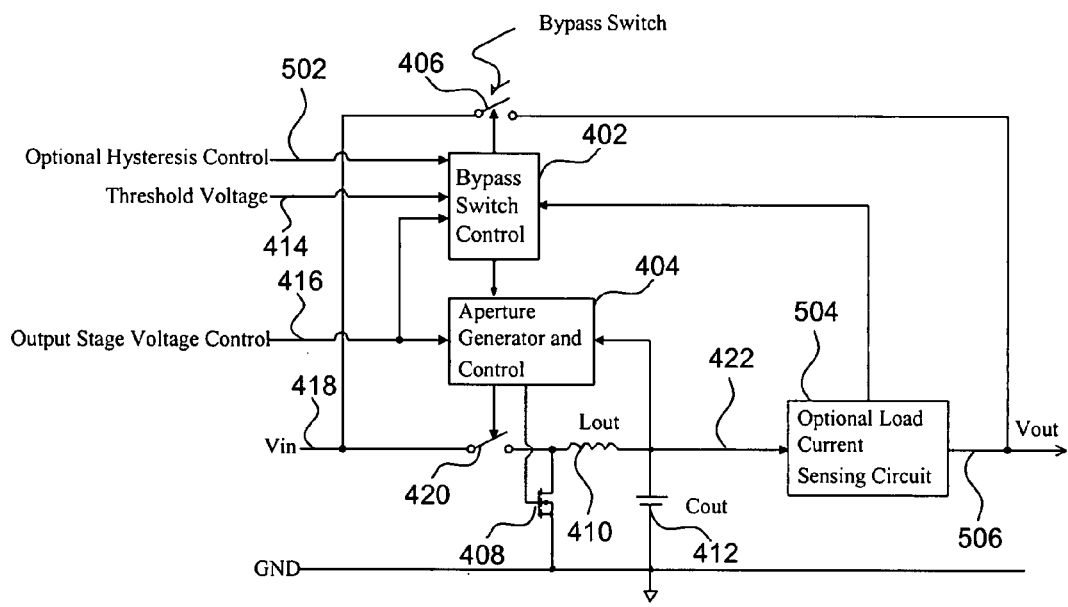
FIG. 5 illustrates another example step down switching power supply having a bypass switch architecture.

FIG. 5 illustrates another example step down switching power supply 500 having a bypass switch architecture.

Switching power supply 500 is similar in several respects to example power supply 400 of FIG. 4. Additionally, switching power supply 500 includes an Optional Hysteresis Control signal 502, which is received by Bypass Switch Control module 402, and an Optional Load Current Sensing Circuit 504.

Operation of Bypass Switch Control module 402 is as follows in example switching power supply 500. Bypass Switch Control module 402 receives Threshold Voltage signal 414, Output Stage Voltage Control signal 416, and Optional Hysteresis Control signal 502.

Bypass Switch Control module 402 compares the value of Output Stage Voltage Control signal 416 to the sum of Threshold Voltage signal 414 and Optional Hysteresis Control signal 502.

When Output Stage Voltage Control signal 416 exceeds the sum of Threshold Voltage signal 414 and Optional Hysteresis Control signal 502, Bypass Switch Control module 402 controls Aperture Generator and Control module to cause it to de-couple input voltage signal $V_{IN}$ 418 from the collector/drain node of switching transistor 408 and to shut off switching transistor 408. At the same time, Bypass Switch Control module 406 controls Bypass Switch 406 to couple input voltage signal $V_{IN}$ 418 to the power supply output node 506.

On the other hand, when Output Stage Voltage Control signal 416 falls below the sum of Threshold Voltage signal 414 and Optional Hysteresis Control signal 502, Bypass Switch Control module 402 controls Bypass Switch 406 to de-couple input voltage signal $V_{IN}$ 418 from the power supply output node 506 and re-activates transistor 408 by coupling input voltage signal $V_{IN}$ 418 thereto through input switch 420.

Optional Hysteresis Control signal 502 can be downloaded or otherwise provided to the mobile device or portable unit using power supply 500 from a network provider. In another embodiment, Optional Hysteresis Control signal 502 can be pre-programmed based on waveform efficiency requirements and/or modified or adjusted based on changes in battery voltage and/or required output power.

Optional Load Current Sensing Circuit 504 is coupled at output node 422 of power supply 500. In an embodiment, Load Current Sensing Circuit 504 senses load current to determine any variations that may affect power supply output voltage $V_{out}$ 506. Further, Optional Load Current Sensing Circuit 504 provides a feedback signal to Bypass Switch Control module 402. In an embodiment, the feedback signal includes information about sensed load current, which can be used by Bypass Switch Control module 402 to control the operation mode of switching power supply 500.

The power supply design techniques discussed above have been described with respect to step down switching power supplies. Embodiments of the present invention are not limited to these embodiments. As would be understood by a person skilled in the art based on the teachings herein, the power supply design techniques described herein can be applied to step down switching power supplies (buck), step up switching power supplies (boost), and step down and step up (buck-boost) power supplies.

Figure 6:
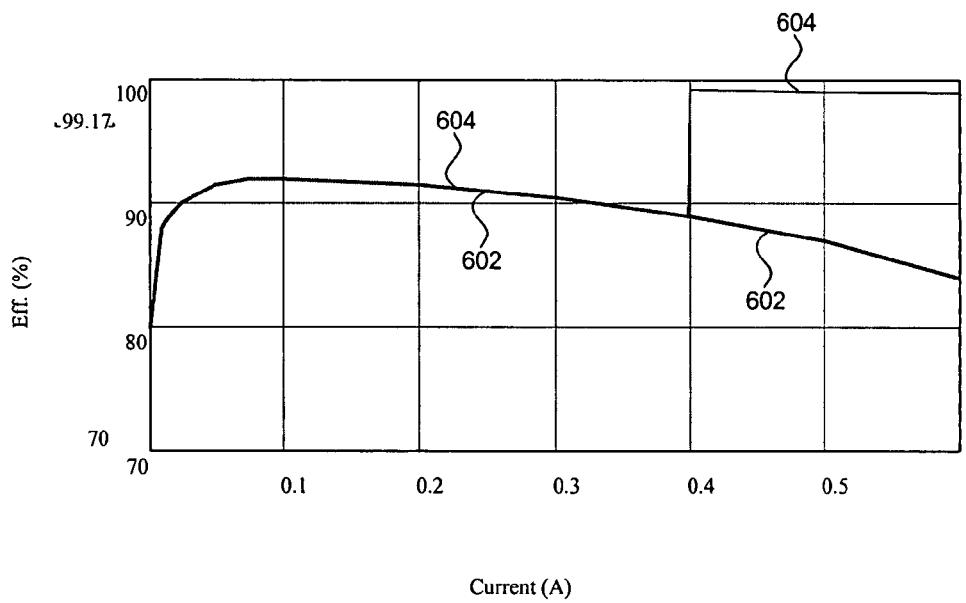
FIG. 6 illustrates example efficiency enhancement due to the use of a bypass switch architecture in a switching power supply.

FIG. 6 is an example graph 600 that illustrates efficiency enhancement due to the use of a bypass switch architecture in a switching power supply. In example 600, the switching power supply is optimized for a +17 dBm output (1.39V output voltage and 100 mA output current).

Efficiency curve 602 represents the efficiency versus the output current of the switching power supply without a bypass switch. Efficiency curve 604 represents the efficiency versus the output current of the switching power supply with a bypass switch. Note that the two efficiency curves 602 and 604 overlap with each other over the output current range from 0 to approximately 0.4 A.

Without a bypass switch, as illustrated by efficiency curve 602, the switching power supply has its highest efficiency between 70 and 100 mA of output current, which renders the highest system efficiency of the exemplary MISO amplifier in the example network statistics.

On the other hand, with a bypass switch architecture, as illustrated by efficiency curve 604, the power supply efficiency can be further increased when the output current exceeds 400 mA. This in turn increases the network system efficiency when the required output power is equal to or greater than 400 mW (+26 dBm).

The optional bypass switch architecture can also be used to increase the maximum current range of the power supply design. For example, if the switching power supply circuitry (without the bypass switch) can supply a maximum of 650 mA but the bypass switch is designed to support up to 1500 mA, the power supply can as a result supply up to 1500 mA. The bypass switch has yet another advantage, which includes the suppression of switching noise or ripple presented to the amplifier when the bypass switch is engaged and the switching power supply is turned off. This results in a reduced system noise floor when the bypass switch is engaged.

In what follows, the positioning/integration of the switching power supply within a power amplifier design or a system using the power amplifier design is described.

Figure 7:
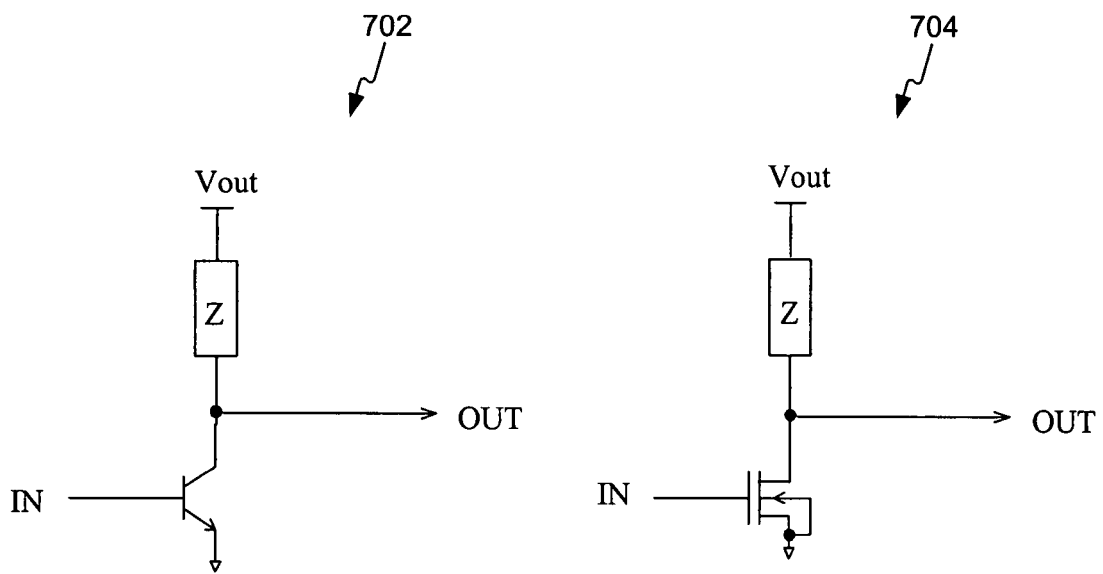
FIG. 7 illustrates examples of coupling a switching power supply to traditional amplifier designs.

FIG. 7 illustrates examples 702 and 704 of coupling a switching power supply to traditional amplifier designs. In example 702, the switching power supply, represented by voltage signal Vout, is coupled (optionally through a pull-up resistance) to the collector/emitter node of an NPN/PNP-based amplifier. Similarly, in example 702, the switching power supply, represented by voltage signal Vout, is coupled (optionally through a pull-up resistance) to the drain/source node of an NMOS/PMOS-based amplifier.

Figure 8:
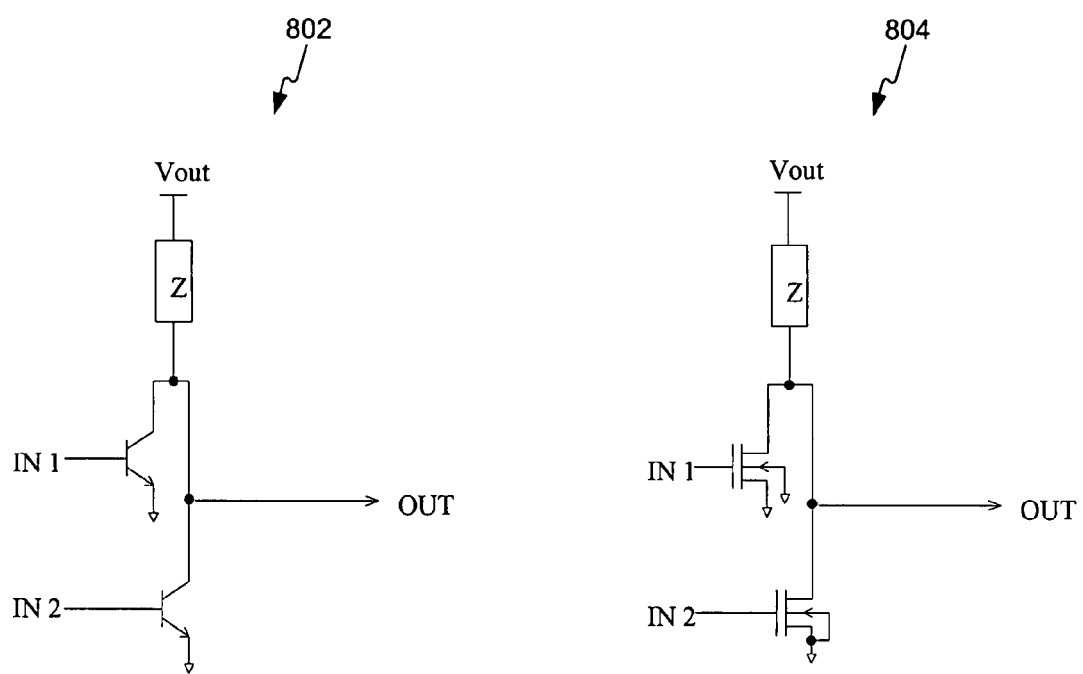
FIG. 8 illustrates examples of coupling a switching power supply to multiple-input-single-output (MISO) amplifier designs.
Figure 9A:
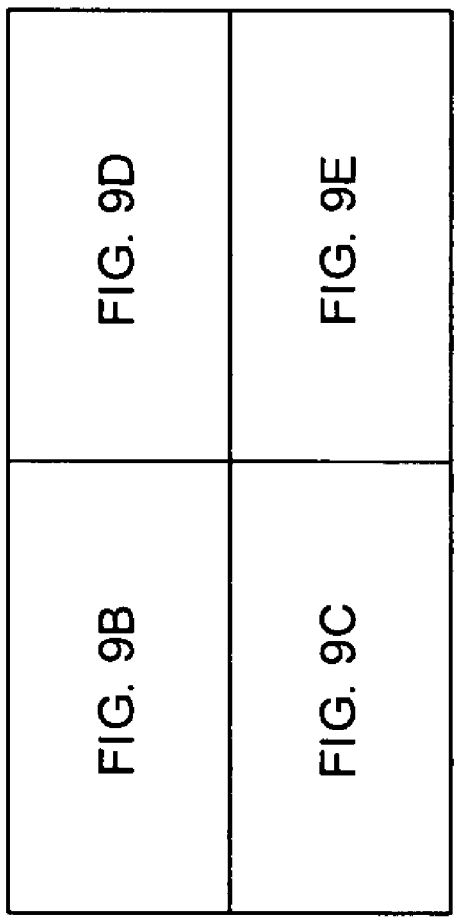
FIGS. 9A-9E illustrate the integration of a switching power supply in a D2P vector power amplification system according to an embodiment of the invention.
Figure 9B:
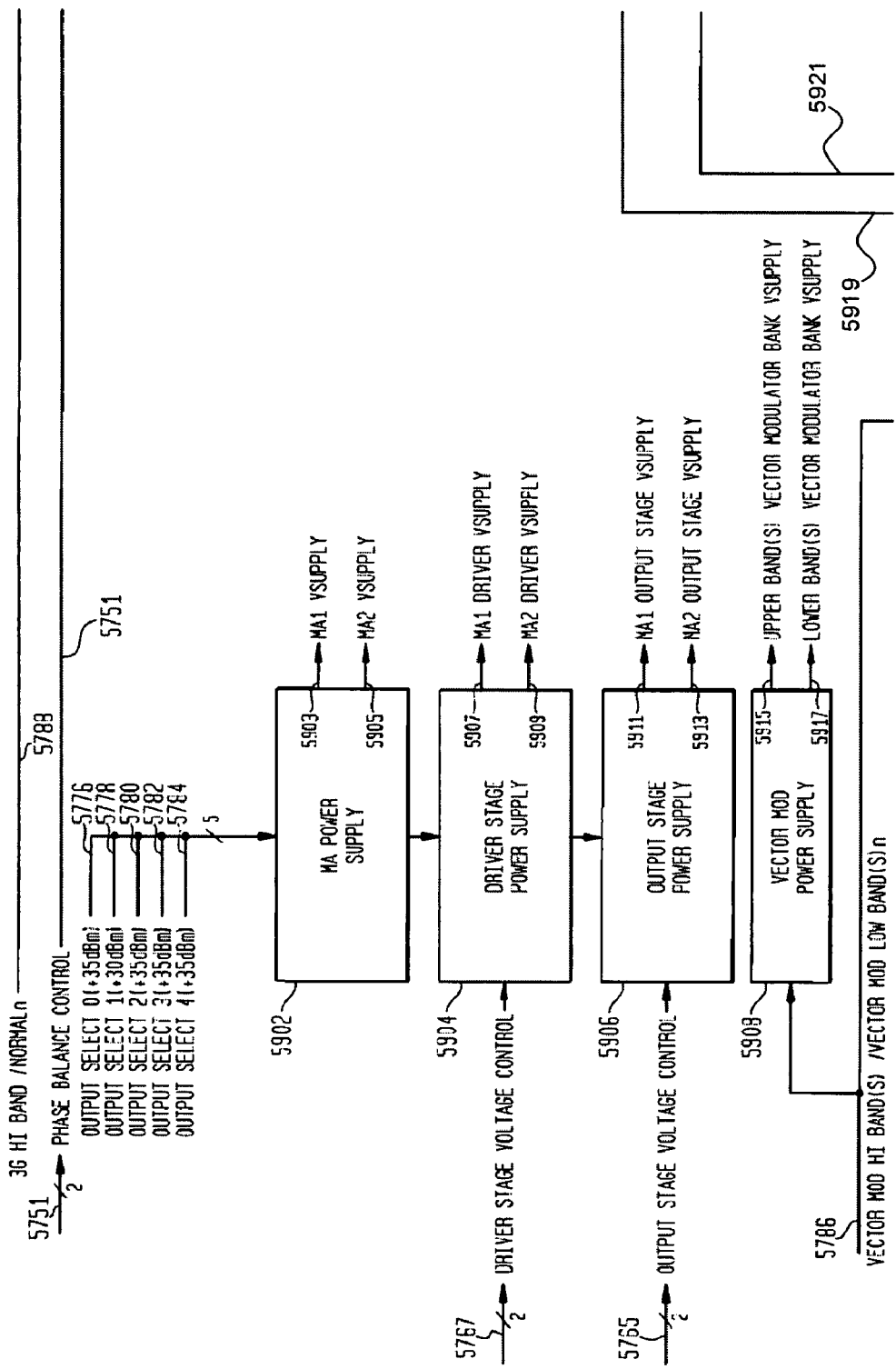
Figure 9C:
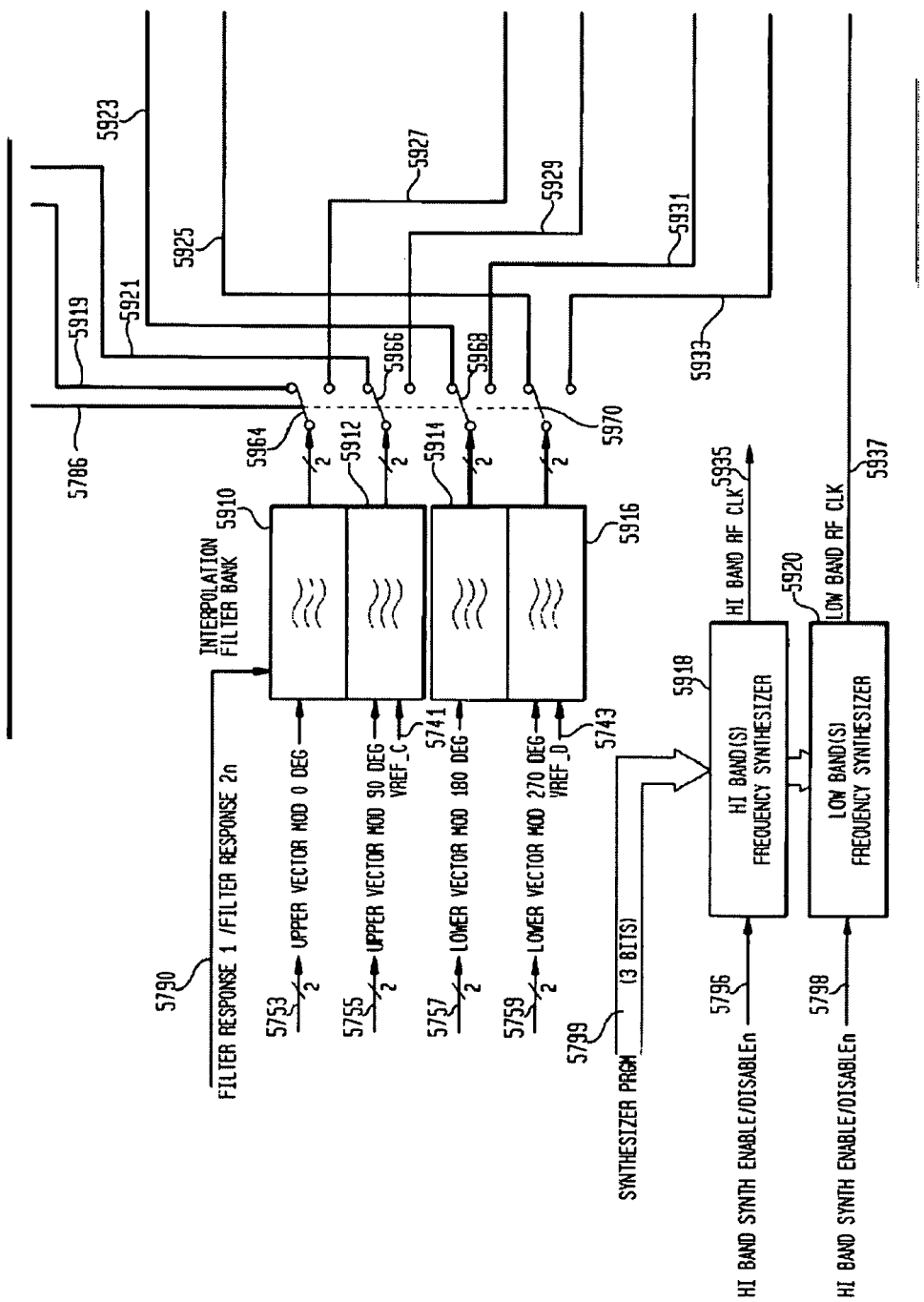
Figure 9D:
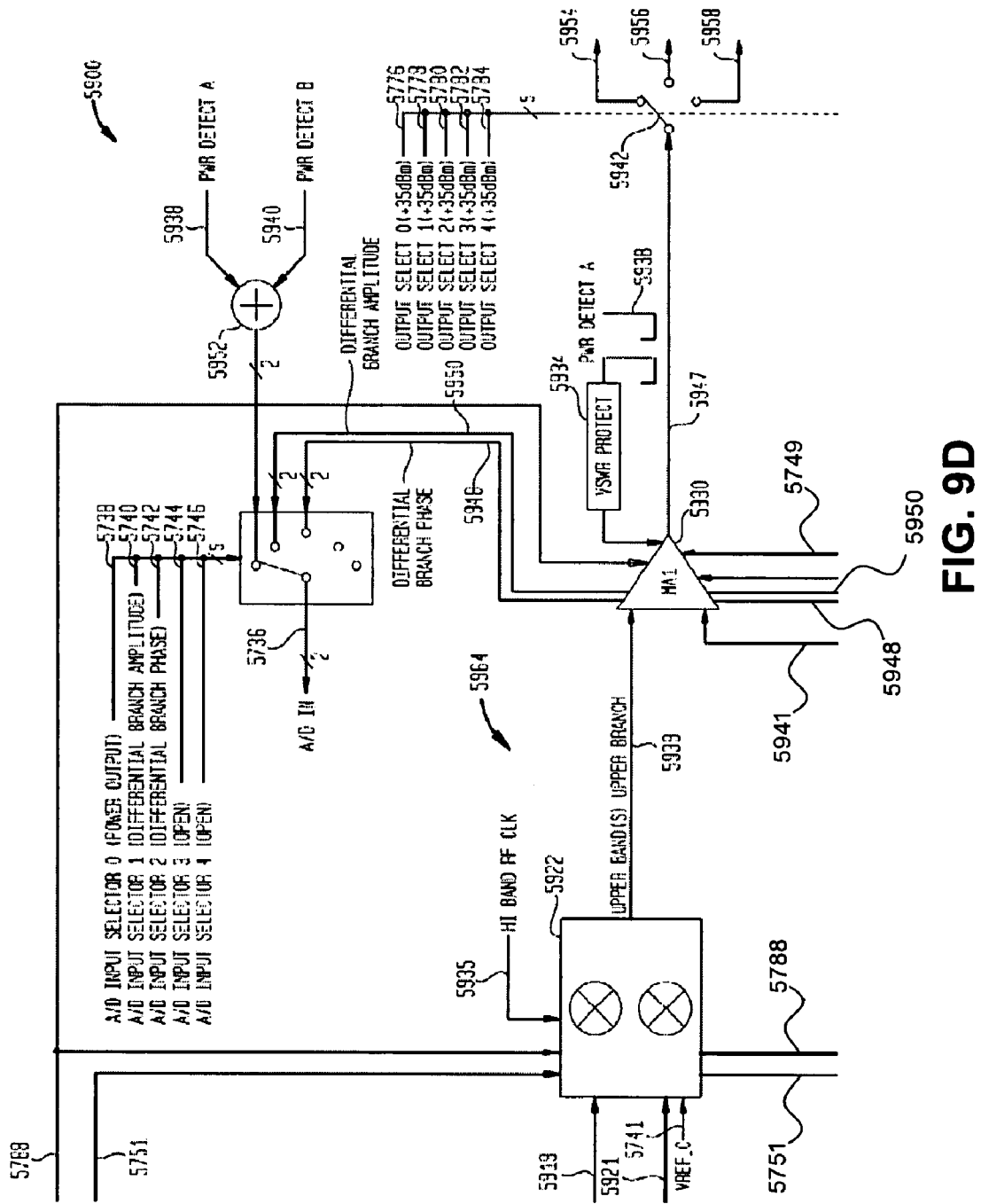
Figure 9E:
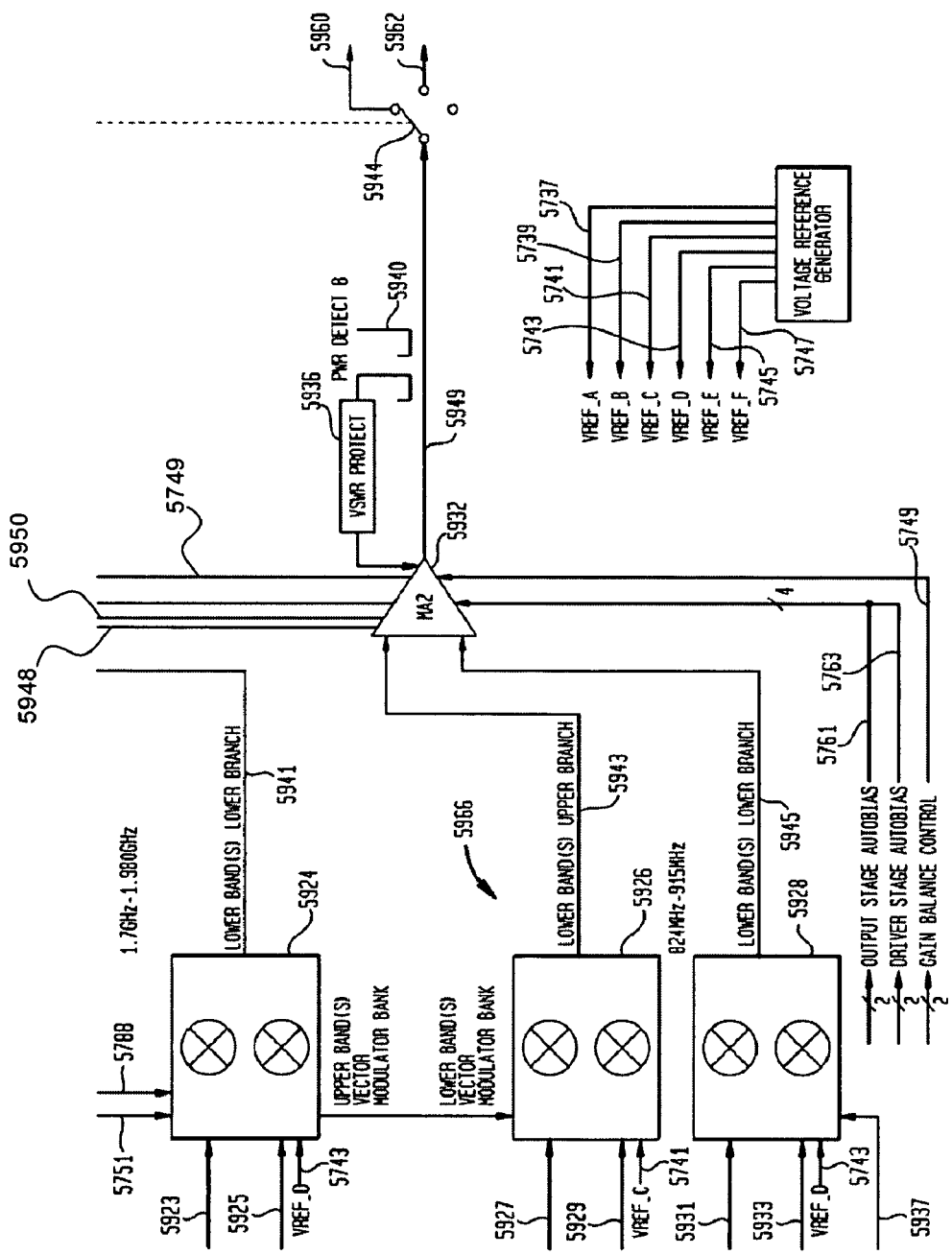
Figure 10A:
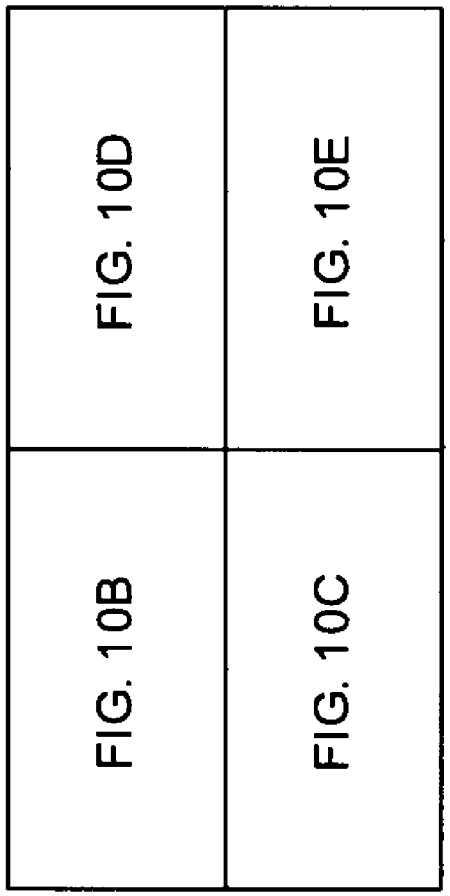
FIGS. 10A-10E illustrate the integration of a switching power supply in another D2P vector power amplification system according to an embodiment of the invention.
Figure 10B:
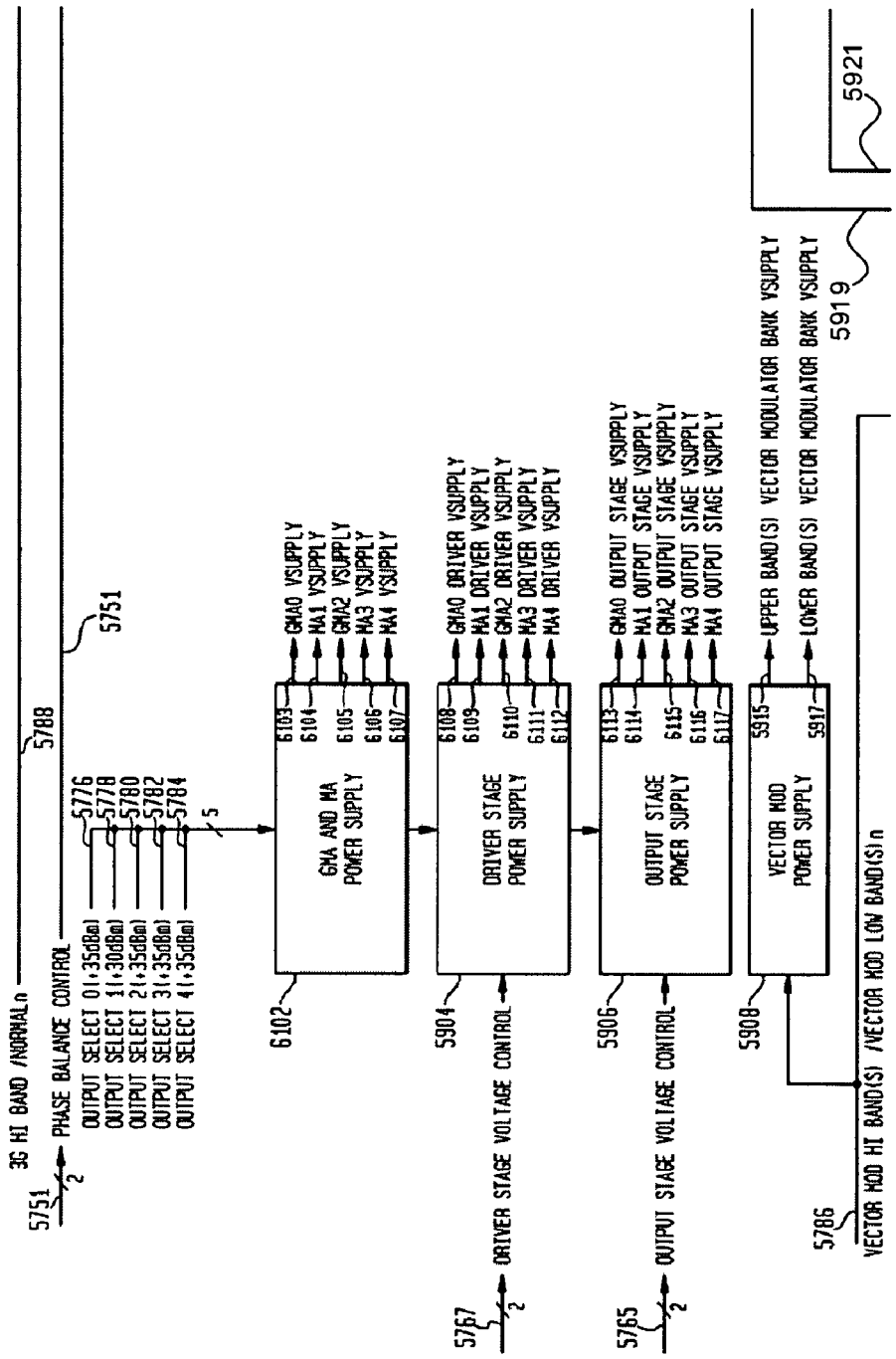
Figure 10C:
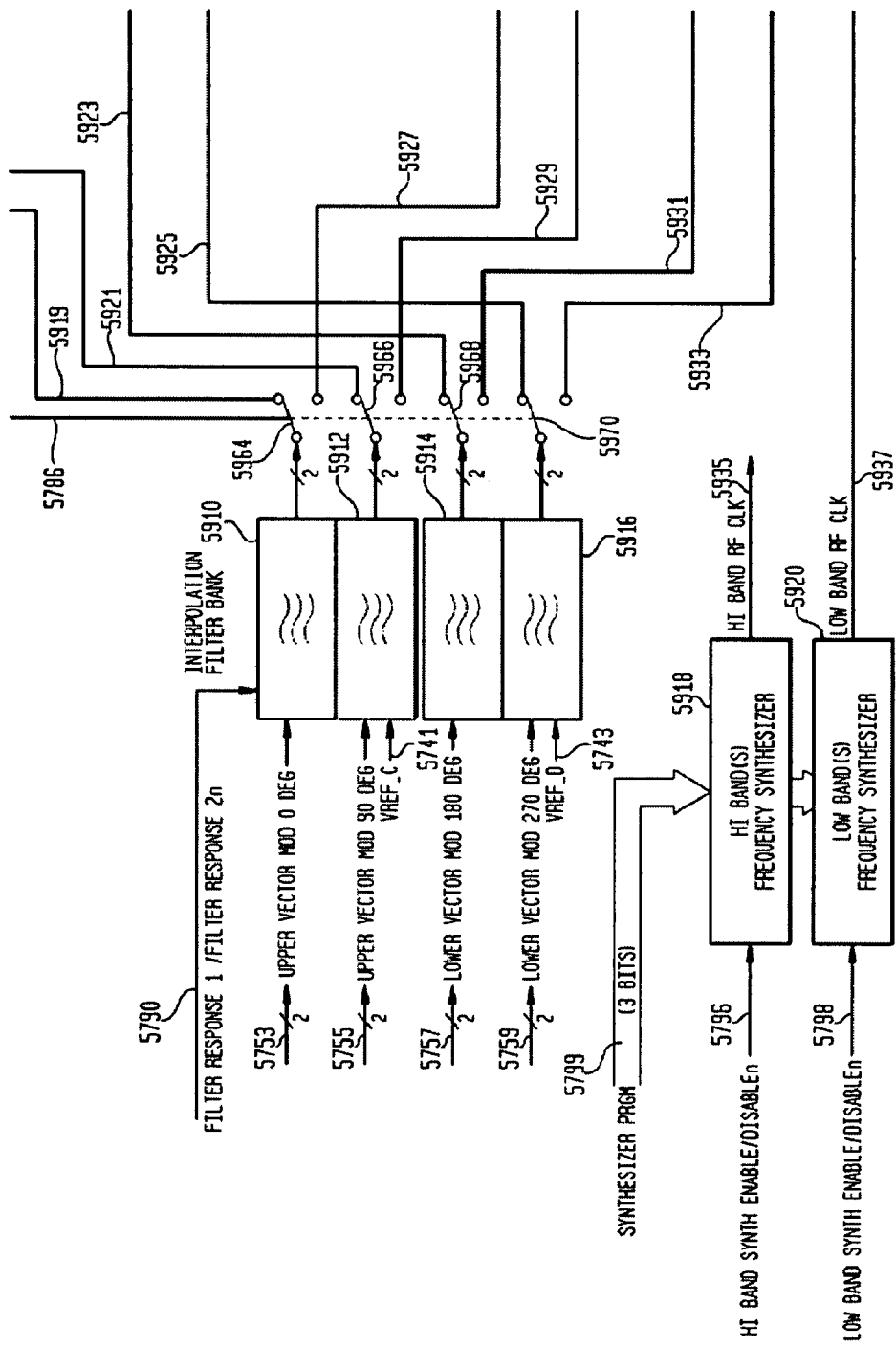
Figure 10D:
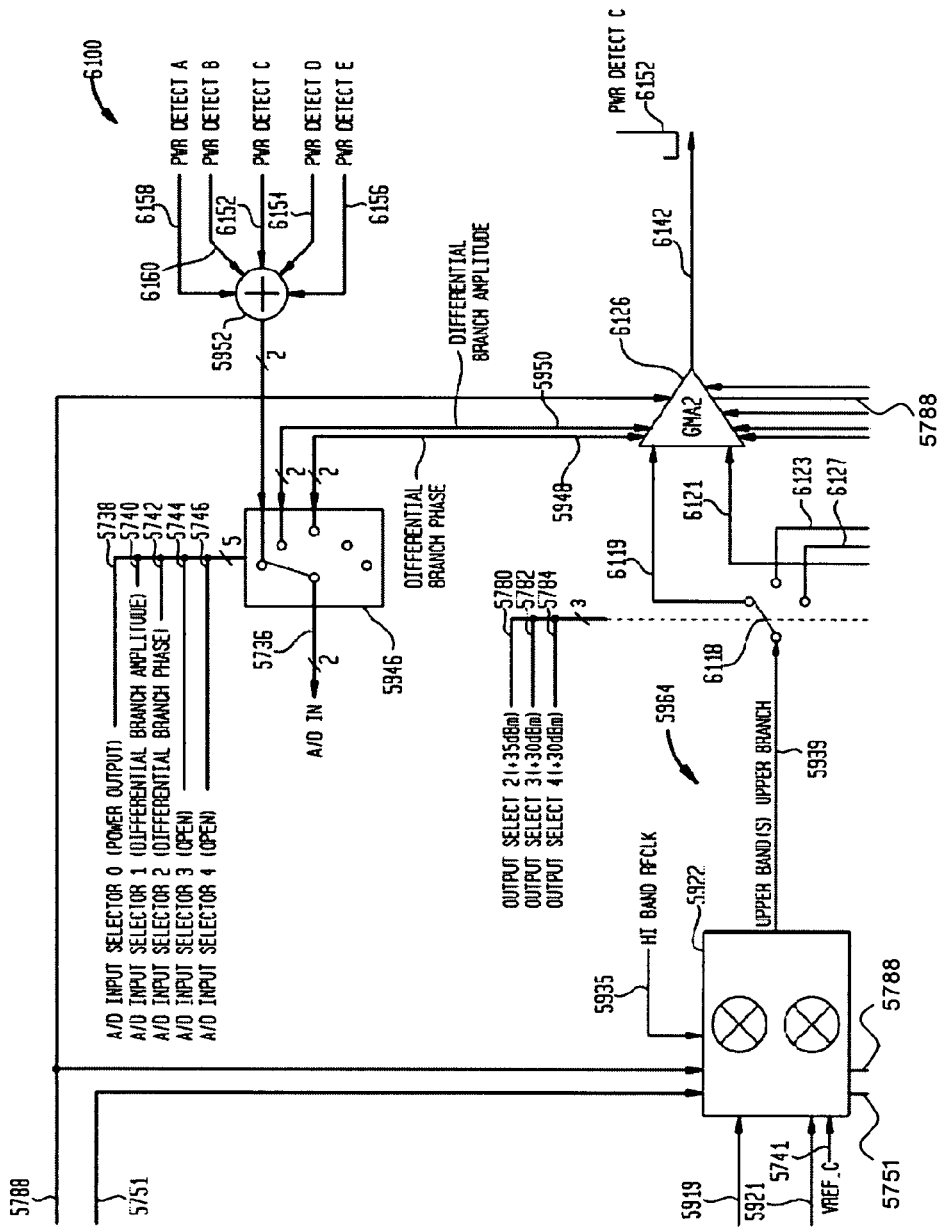
Figure 10E:
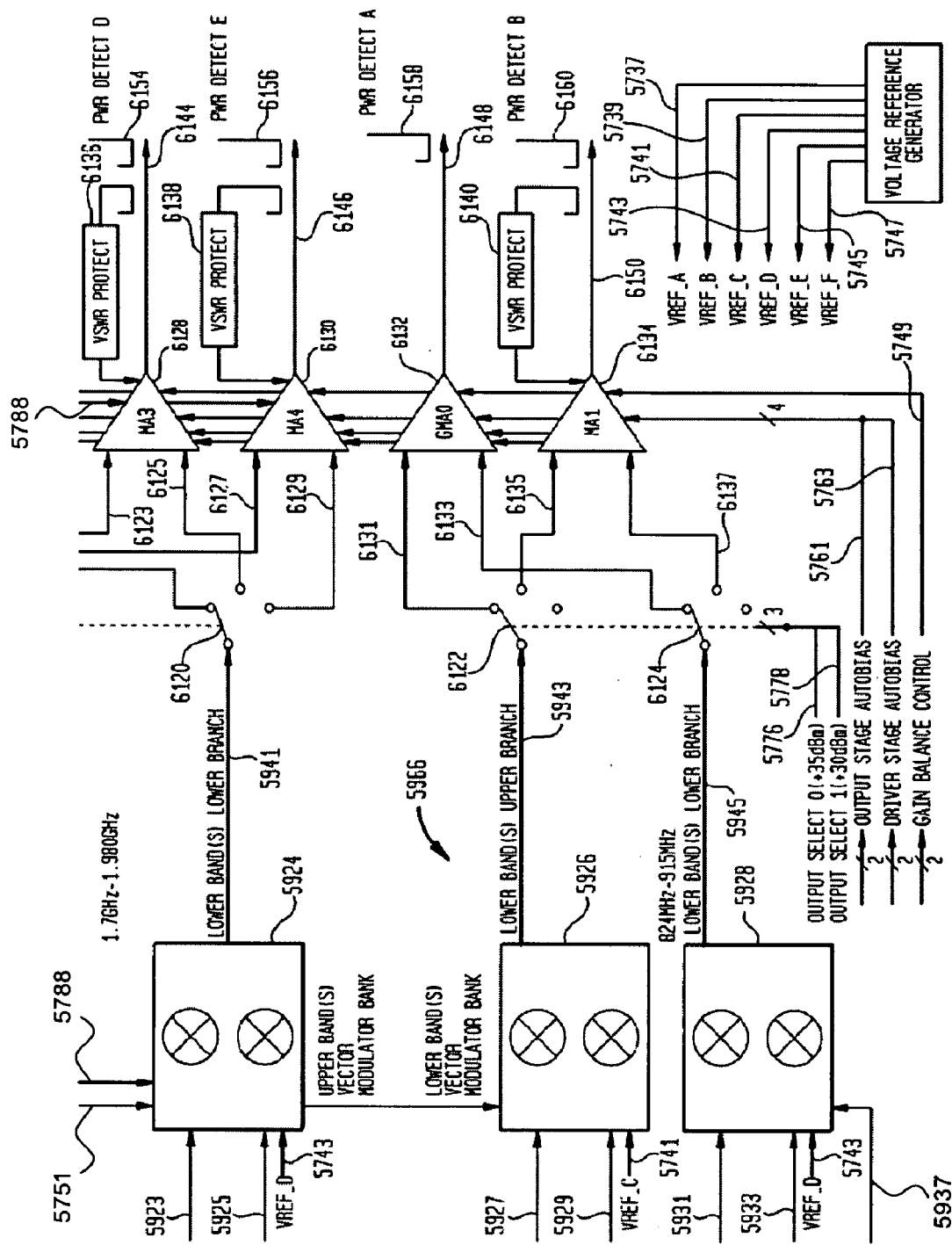

FIG. 8 illustrates similar examples 802 and 804 of coupling a switching power supply to multiple-input-single-output (MISO) amplifier designs. Example 802 illustrates the coupling of the switching power supply, represented by voltage signal Vout, to an exemplary two-input single output BJT-based (NPN/PNP/Hybrid) MISO amplifier. The switching power supply can be coupled (optionally through a pull-up resistance) to the common collector/emitter node of the MISO transistors. Similarly, example 804 illustrates the coupling of the switching power supply, represented by voltage signal Vout, to an exemplary two-input single output FET-based (NMOS/PMOS/Hybrid) MISO amplifier. The switching power supply can be coupled (optionally through a pull-up resistance) to the common drain/source node of the MISO transistors.

The switching power supply (with optional bypass switch architecture) can be used to increase the system efficiency of the exemplary traditional and MISO amplifier designs described above. Further, the switching power supply (with optional bypass switch architecture) can be designed to operate with and optimize the system efficiency of any of the MISO amplifier architectures and schematics shown in related U.S. patent application Ser. Nos. 11/256,172 and 11/508,989.

FIGS. 9A-9E illustrate an example D2P Vector Power Amplification system 5900, which uses an embodiment of the switching power supply described herein to power its output stage. The output stage of system 5900 includes two MISO amplifiers MA1 5930 and MA2 5932. The switching power supply is integrated in system 5900 as Output Stage Power Supply module 5906, shown in FIG. 9B. The switching power supply receives an Output Stage Voltage Control signal 5765 and outputs two output stage supply voltage signals MA1 Output Stage VSupply 5911 and MA2 Output Stage VSupply 5913, which power MA1 5930 and MA2 5932, respectively. Further description of system 5900 can be found in related U.S. patent application Ser. No. 11/508,989, incorporated herein by reference in its entirety.

FIGS. 10A-10E illustrate another example D2P Vector Power Amplification system 6100, which uses an embodiment of the switching power supply described herein to power its output stage. The output stage of system 6100 includes five MISO amplifiers GMA2 6126, MA3 6128, MA4 6130, GMA0 6132, and MA1 6134. The switching power supply is integrated in system 6100 as Output Stage Power Supply module 5906, shown in FIG. 10B. The switching power supply receives an Output Stage Voltage Control signal 5765 and outputs five output stage supply voltage signals GMA0 Output Stage VSupply 6113, MA1 Output Stage VSupply 6114, GMA2 Output Stage VSupply 6115, MA3 Output Stage VSupply 6116, and MA4 Output Stage VSupply 6117, which power MISO amplifiers GMA0 6132, MA1 6134, GMA2 6126, MA3 6128, and MA4 6130, respectively. Further description of system 5900 can be found in related U.S. patent application Ser. No. 11/508,989, incorporated herein by reference in its entirety.

Embodiments of the switching power supply and bypass switch design techniques described herein can be applied to any modulation and/or amplification circuitry or stage within a multi-stage amplification system, to enhance the system efficiency. For example, in addition to being applied to the output stage of MISO amplifiers MA1 5930 and MA2 5932, embodiments described herein can be applied to a Driver Stage and/or a Pre-Driver Stage within each of MISO amplifiers MA1 5930 and MA2 5932. As such, power supplies designed to power up these amplification stages (e.g., Driver Stage Power Supply 5904 in FIGS. 9B and 10B) can be configured to operate in optimum voltage and current ranges to provide increased system efficiency.

In other embodiments, the Driver Stage Power Supply and the Output Stage Power Supply can be combined into a single switching power supply design. The combined switching power supply may or may not employ a bypass switch architecture depending on the system design requirements.

CONCLUSION

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A power supply, comprising:
a transistor to receive, through an input switch, an input voltage, and comprising an output node;
an aperture generator and control module to receive an output voltage control signal, and to control said input switch; and
a bypass switch control module to receive said output voltage control signal and a threshold voltage, and to control a bypass switch;
wherein said bypass switch control module causes said bypass switch to couple said input voltage to said output node, and causes said input switch to de-couple said input voltage from said transistor, when said output voltage control signal exceeds said threshold voltage.

2. The power supply of claim 1, wherein said output voltage control signal is received from an amplification stage being powered by the power supply.

3. The power supply of claim 1, wherein said bypass switch control module controls said aperture generator and control module, in order to control said input switch.

4. The power supply of claim 1, wherein said aperture generator and control module controls an input node of said transistor, thereby controlling the point of operation and gain of said transistor.

5. The power supply of claim 1, wherein said aperture generator and control module controls said transistor according to said output voltage control signal.

6. The power supply of claim 1, wherein said aperture generator and control module receives a power supply output feedback signal and controls said transistor according to said feedback signal.

7. The power supply of claim 1, wherein said transistor comprises one or more of NMOS transistors, PMOS transistors, NPN transistors, and PNP transistors.

8. The power supply of claim 1, wherein said bypass switch control module compares said output voltage control signal and said threshold voltage.

9. The power supply of claim 1, wherein said bypass switch control module causes said bypass switch to couple said input voltage to said output voltage node, and causes said input switch to de-couple said input voltage from said transistor, when noise power on or substantially near an output frequency exceeds a threshold.

10. The power supply of claim 1, wherein said bypass switch control module causes said bypass switch to couple said input voltage to said output voltage node, and causes said input switch to de-couple said input voltage from said transistor, when said output voltage control signal exceeds said threshold voltage by the value of a hysteresis control signal.

11. The power supply of claim 1, further comprising:
a load current sensing circuit, coupled to said output node of the power supply, to measure load current variations and to provide a feedback signal to said bypass switch control module.

\* \* \* \* \*